(12) United States Patent
Schaffer

(10) Patent No.: US 6,946,740 B2
(45) Date of Patent: Sep. 20, 2005

(54) HIGH POWER MCM PACKAGE

(75) Inventor: Christopher P. Schaffer, Long Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 93 days.

(21) Appl. No.: 10/620,029

(22) Filed: Jul. 14, 2003

(65) Prior Publication Data

US 2004/0061221 A1 Apr. 1, 2004

Related U.S. Application Data

(60) Provisional application No. 60/396,342, filed on Jul. 15, 2002.

(51) Int. Cl.[7] ............................................. H01L 23/48
(52) U.S. Cl. ...................... 257/777; 257/778; 257/779; 257/780
(58) Field of Search ................................. 257/704, 706, 257/707, 777, 686–680, 776, 724, 690, 691, 685, 723; 438/106

(56) References Cited

U.S. PATENT DOCUMENTS

| 5,313,095 A | 5/1994 | Tagawa et al. |
| 5,384,691 A | 1/1995 | Neugebauer et al. |
| 5,768,774 A * | 6/1998 | Wilson et al. ................. 29/840 |
| 5,786,230 A | 7/1998 | Anderson et al. |
| 6,137,165 A | 10/2000 | Thierry |
| 6,340,842 B1 * | 1/2002 | Nakamura ................... 257/724 |
| 6,437,990 B1 * | 8/2002 | Degani et al. .............. 361/783 |
| 6,657,864 B1 * | 12/2003 | Dyckman et al. ........... 361/704 |
| 6,677,669 B2 * | 1/2004 | Standing ...................... 257/685 |
| 2002/0175404 A1 * | 11/2002 | Yoshikawa ................... 257/706 |
| 2003/0122245 A1 * | 7/2003 | Chu et al. .................... 257/706 |
| 2004/0056346 A1 * | 3/2004 | Palm et al. .................. 257/706 |
| 2004/0164403 A1 * | 8/2004 | Hirao et al. ................. 257/706 |

OTHER PUBLICATIONS

International Search Report mailed Dec. 18, 2003 for PCT Application No. PCT/US03/22160.

* cited by examiner

Primary Examiner—Hoai Pham
Assistant Examiner—Nathan W. Ha
(74) Attorney, Agent, or Firm—Ostrolenk, Faber, Gerb & Soffen, LLP

(57) ABSTRACT

A multi-chip module that includes a conductive element to serve as an electrical connector for electrically connecting respective electrical contacts of at least two power semiconductor devices and serving as an output connector. The conductive element improving heat transfer from the power semiconductor devices through the top of the module.

27 Claims, 7 Drawing Sheets

HIGH POWER MCM PACKAGE

RELATED APPLICATION

This application is based on and claims benefit of U.S. Provisional Application No. 60/396,342, filed Jul. 15, 2002 to which a claim of priority is hereby made.

FIELD OF INVENTION

The present invention relates to multi-chip modules and more particularly to multi-chip power supply modules.

BACKGROUND OF THE INVENTION

Multichip Modules (MCMs) are well known. A typical MCM includes a plurality of diverse elements disposed on one or more substrates enclosed within a molded housing. The diverse elements form an electronic circuit for, for example, driving a motor. Such circuits often include power semiconductor devices which may be connected to one another in a variety of ways.

A conventional circuit arrangement for driving a motor is known as a half-bridge. A half-bridge arrangement includes two power semiconductor devices connected in series. A typical power semiconductor device used in a half-bridge arrangement is a MOSFET, although other power semiconductor devices may also be used.

FIG. 1 shows a half-bridge arrangement using a pair of series-connected MOSFETs 10, 12. As shown in FIG. 1, the source electrode of MOSFET 10 is electrically connected to the drain electrode of MOSFET 12. In this configuration, input voltage Vin is connected to the drain electrode of MOSFET 10 while the source electrode of MOSFET 12 is grounded. The output voltage Vout is tapped at the connection node of MOSFET 10 and MOSFET 12. Typically, one or more schottky diodes 14 are connected in parallel with MOSFET 12 between the output node Vout and ground to minimize losses during dead time conduction period.

Half-bridge arrangements are vastly used in power supply devices. FIG. 2 schematically illustrates a conventional half-bridge arrangement in an MCM. Referring to these figures, according to a conventional arrangement, MOSFETs 10, 12 are disposed on a common circuit board 18. The circuit board 18 may be thermally conductive so that heat generated by the MOSFETs during operation may be transmitted to a heatsink (not shown) which may be placed in thermal contact with the circuit board 18. A suitable circuit board 18 may be an insulated metal substrate (IMS). As shown in FIG. 2, the drain electrode 10A, 12A, of each MOSFET 10, 12 is electrically connected to a respective conductive pad 22, 24 on substrate 18. To complete a half-bridge, source electrode 10B of MOSFET 10 is electrically connnected to drain electrode 12A of MOSFET 12 through, for example a router, source electrode 12B of MOSFET 12 is connected to ground and drain electrode 10A of MOSFET 10 is connected to a voltage source as shown schematically in FIG. 2. Optionally, as shown in FIG. 2, a schottky diode 14 may be connected across drain electrode 12A and source electrode 12B of MOSFET 12 as is well known in the art.

SUMMARY OF THE INVENTION

It is an object of the present invention to provide a compact MCM that exhibits improved heat management.

An MCM according to the preferred embodiment of the present invention includes a conventional power semiconductor device, such as a conventional vertical conduction MOSFET, and a flip-chip arranged in a half-bridge configuration. A flip-chip, as used herein, is a power semiconductor device which is adapted to have its control electrode and its source electrode connected to respective pads on a circuit board. According to an aspect of the invention a common conductive element is used to electrically connect the drain electrode of one power semiconductor device to the source electrode of the other. The other electrodes of the power semiconductor devices are connected to respective pads on the circuit board.

The conductive element includes a web portion which is connected to the power semiconductor devices and a connector integrally connected to the web portion to serve as an electrical connection for connecting the web portion to a respective conductive pad on the circuit board. The connector thus serves as a connection to the output node of the half-bridge.

According to the first embodiment of the present invention, the connector extends from one end of the web portion of the conductive element. That is, the conductive element is L-shaped.

According to the second embodiment, the connector extends from a position between the opposing ends of the web portion. That is, the conductive is T-shaped.

According to the third embodiment, the web portion includes ball contacts at opposing edges thereof instead of an integral connector.

Other features and advantages of the present invention will become apparent from the following description of the invention which refers to the accompanying drawings.

DETAILED DESCRIPTION OF EMBODIMENTS OF THE INVENTION

Figure 3:
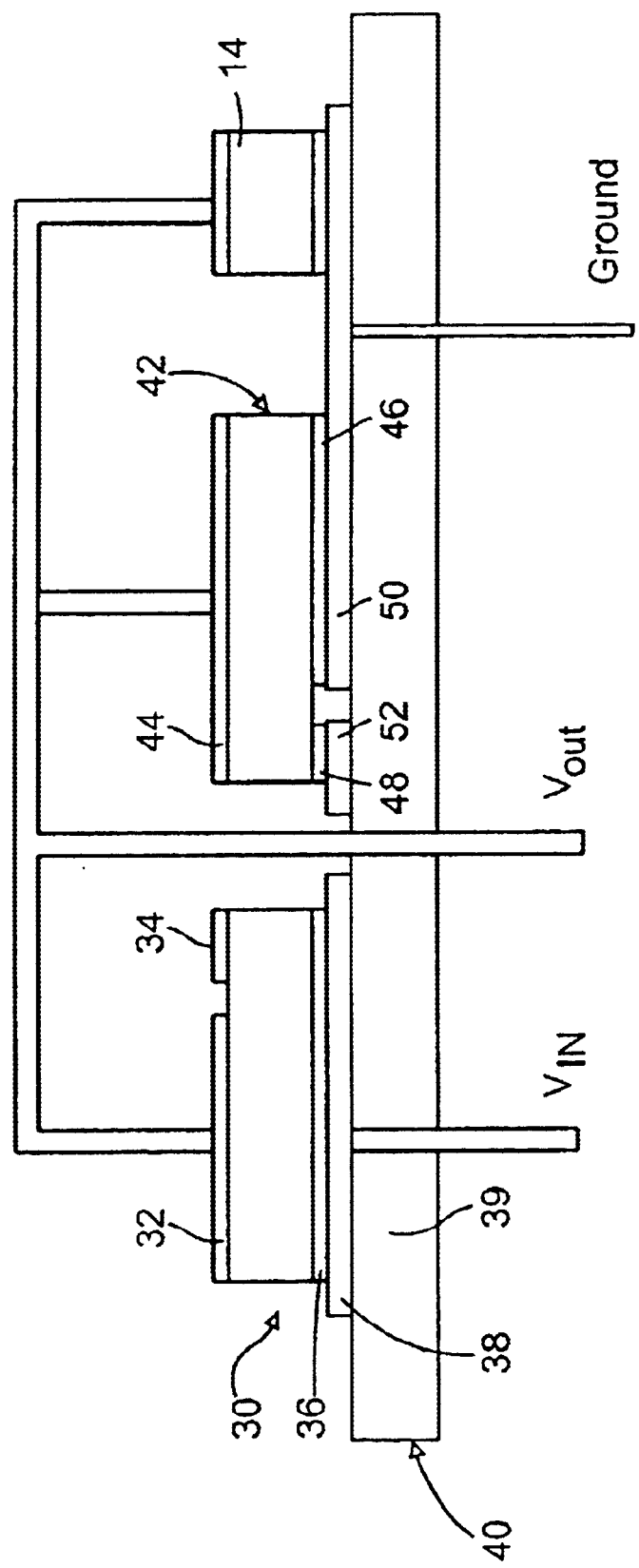
FIG. 3 shows a configuration according to the present invention.

Referring first to FIG. 3, an MCM according to the present invention includes a half-bridge circuit which is implemented by a pair of series connected power semiconductor devices one of which is a conventional device and the other one a flip-chip. According to the preferred embodiment of the present invention, the first one of the power semiconductor devices is a conventional vertical conduction power MOSFET 30 which has disposed on a first major surface thereof source contact 32 and gate contact 34, and on the opposing second major surface thereof drain contact 36. Drain contact 36 of power MOSFET 30 is electrically connected to conductive pad 38, by for example, a layer of solder, or conductive epoxy. Conductive pad 38 is part of a printed circuit board 40. Printed circuit board 40 may be an insulated metal substrate (IMS) or double-bonded copper (DBC) which includes a thermally conductive, but electrically insulative substrate 39 on which conductive pad 38 is disposed. A lead frame structure may be substituted for printed circuit board 40 without deviating from the present invention.

According to an aspect of the present invention, the other power semiconductor device in an MCM according to the present invention is a flip-chip MOSFET 42. Flip-chip MOSFET 42 includes a drain electrode 44 on one major surface, and source electrode 46 and gate electrode 48 on an opposing major surface thereof. Source electrode 46 is electrically connected to conductive pad 50, while gate electrode 48 is electrically connected to conductive pad 52. Conductive pad 50 and conductive pad 52 are disposed on substrate 39 and form part of circuit board 40. Optionally, a schottky diode (not shown) is connected in parallel with flip-chip 42 between the output node and the ground in order to minimize losses during dead time conduction.

Figure 1:
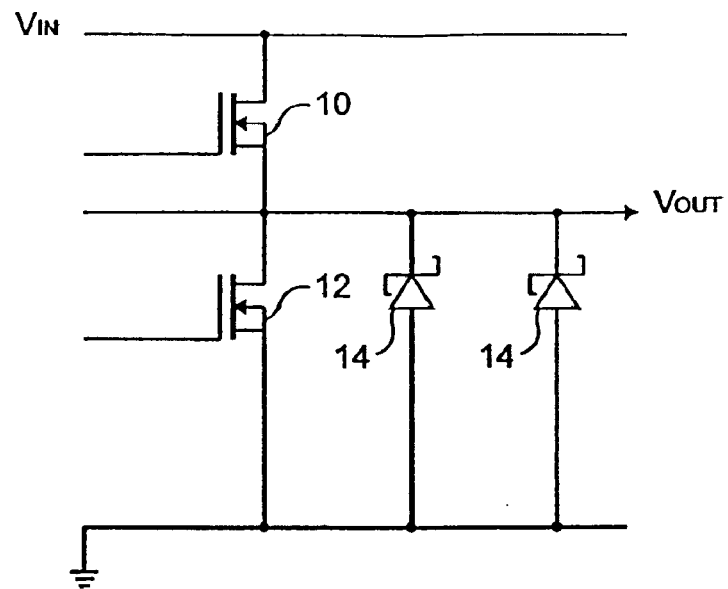
FIG. 1 shows a circuit configuration for a half-bridge circuit according to prior art.
Figure 2:
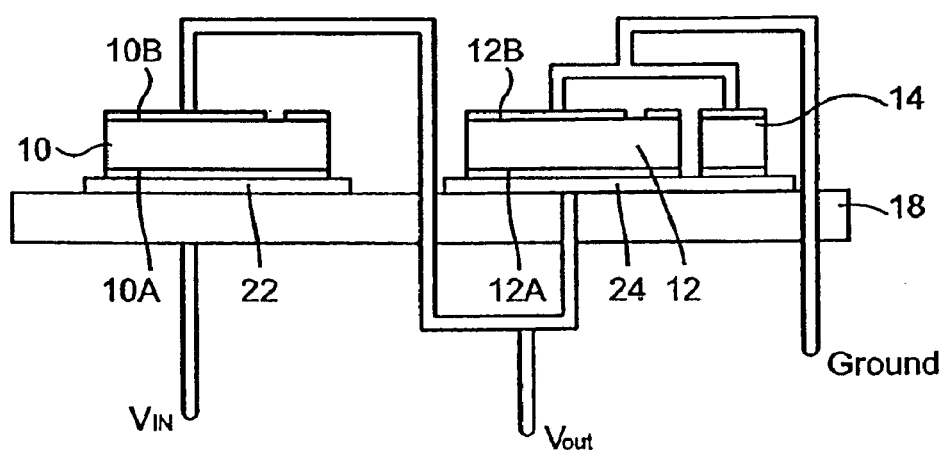
FIG. 2 shows a half-bridge configuration as used in a conventional MCM according to the prior art.

As schematically shown in FIG. 3, the half-bridge circuit according to the present invention is implemented by directly connecting source contact 32 of MOSFET 30 to drain contact 44 of flip-chip MOSFET 42 to obtain the series connection shown by FIG. 1. In the preferred configuration shown by FIG. 3, conductive pad 38 serves as the input connection Vin, while conductive pad 50 serves as the ground connection. The output connection Vout in the preferred embodiment is a point between source contact 32 of MOSFET 30 and drain contact 44 of flip-chip MOSFET 42.

Figure 4:
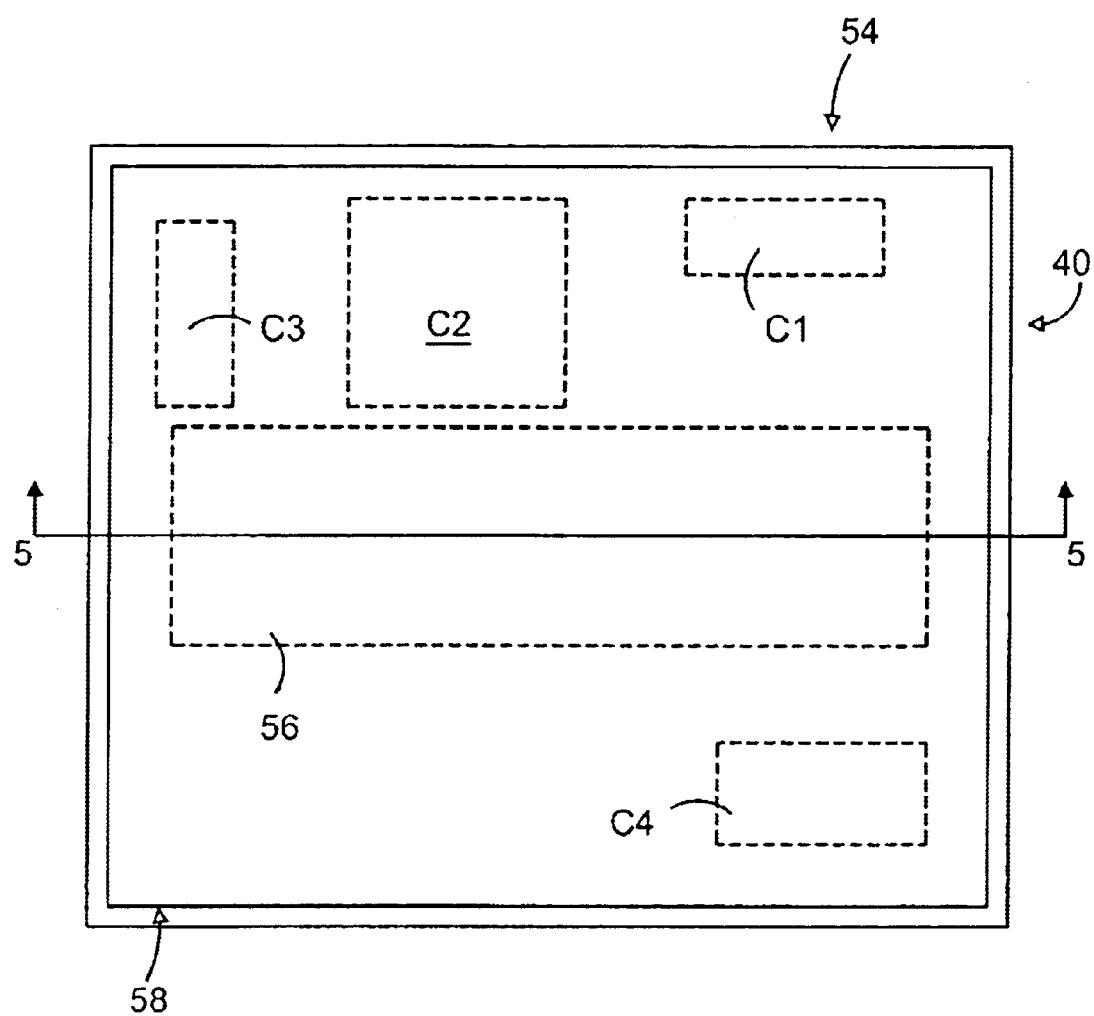
FIG. 4 shows a top plan view of an MCM layout according to the present invention.

FIG. 4 shows the top plan view of an MCM 54 according to the present invention. MCM 54 includes a printed circuit board 40 on which a plurality of components $C_1$, $C_2$, $C_3$, $C_4$ are disposed. According to an aspect of the present invention, MCM 54 also includes conductive element 56. Conductive element 56 serves to connect a power semiconductor device, such as a conventional MOSFET 30 (FIG. 3), to a flip-chip semiconductor device; such as flip-chip MOSFET 42 (FIG. 3), and also serves as the output connection according to the arrangement shown in FIG. 3. As is conventionally known, a molded housing 58 encapsulates all of the components disposed on circuit board 40. The circuit formed on circuit board 40 may be connected to external components via external leads (not shown) which may be disposed anywhere outside of the molded housing 58. For example, external leads may be disposed on the edges of MCM 54 or on the bottom surface of circuit board 40 in a ball grid array (BGA) or land array format.

Figure 5:
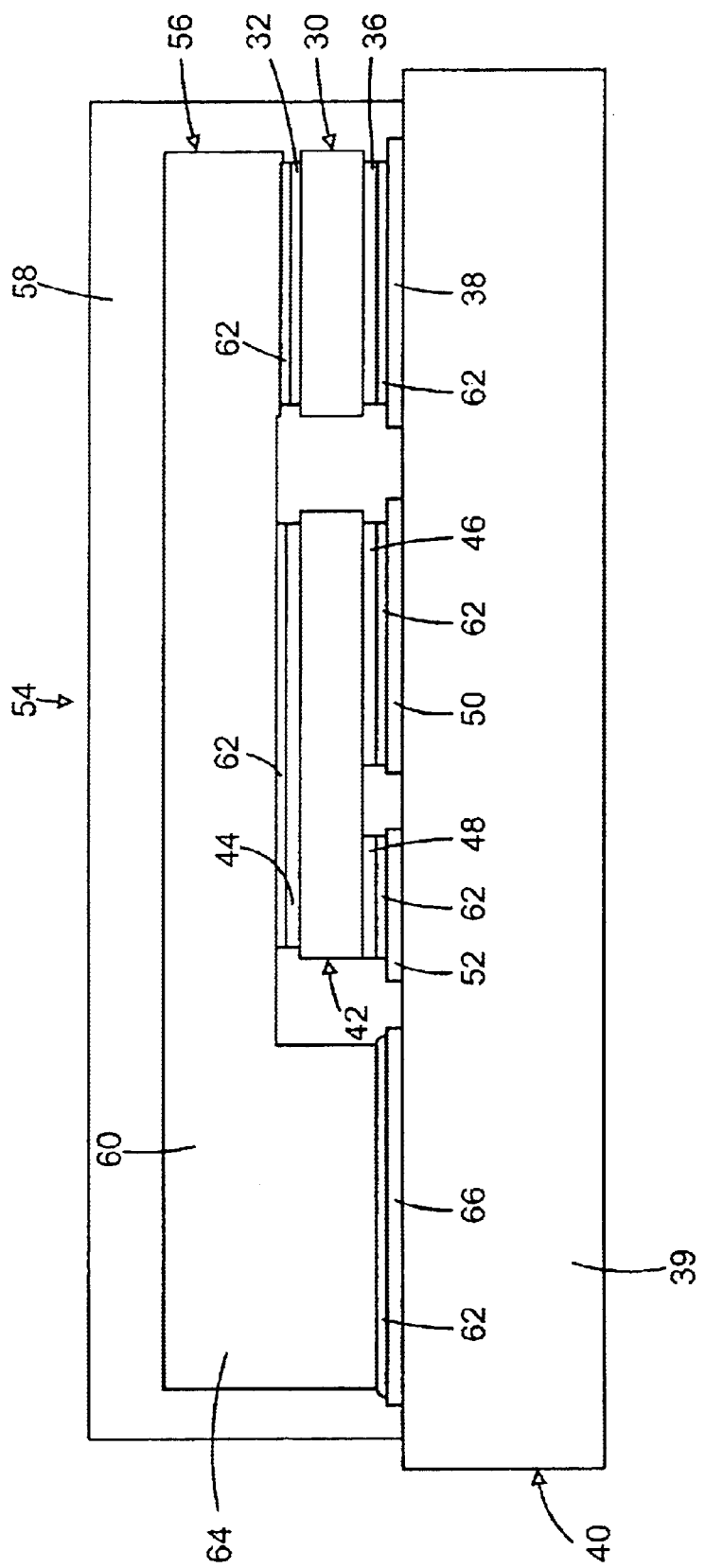
FIG. 5 shows a cross-sectional view of an MCM according to the first embodiment of the present invention viewed along line 5—5 looking in the direction of the arrows.

FIG. 5 shows a cross-sectional view of MCM 54 along line 5—5 looking in the direction of the arrows. As seen in FIG. 5, according to the first embodiment of the present invention, MCM 54 includes conductive element 56. Conductive element 56 includes web portion 60 which connects drain contact 44 of flip-chip MOSFET 42 to source contact 32 of conventional MOSFET 30. As described before with reference to FIG. 3, source contact 46 of flip-chip MOSFET 42 is electrically connected to conductive pad 50 by a conductive layer 62 such as solder or conductive epoxy. Similarly, gate contact 48 of flip-chip MOSFET 42 is electrically connected to conductive pad 52 by a conductive layer 62. Drain contact 36 of conventional MOSFET 30 is also electrically connected to conductive pad 38 by a conductive layer 62.

According to an aspect of the present invention, conductive element 56 also includes connector 64 which extends from an end thereof, and is electrically connected to conductive pad 66 by conductive layer 62. Web portion 60 and connector 64 are integral with one another, and in the preferred embodiment of the present invention form a unitary body.

In an MCM according to the present invention conductive pad 66 serves as the output Vout (FIG. 3) of the half-bridge circuit, while conductive pad 50 and conductive pad 38 are connected to the ground and input Vin (FIG. 3) respectively.

Figure 6:
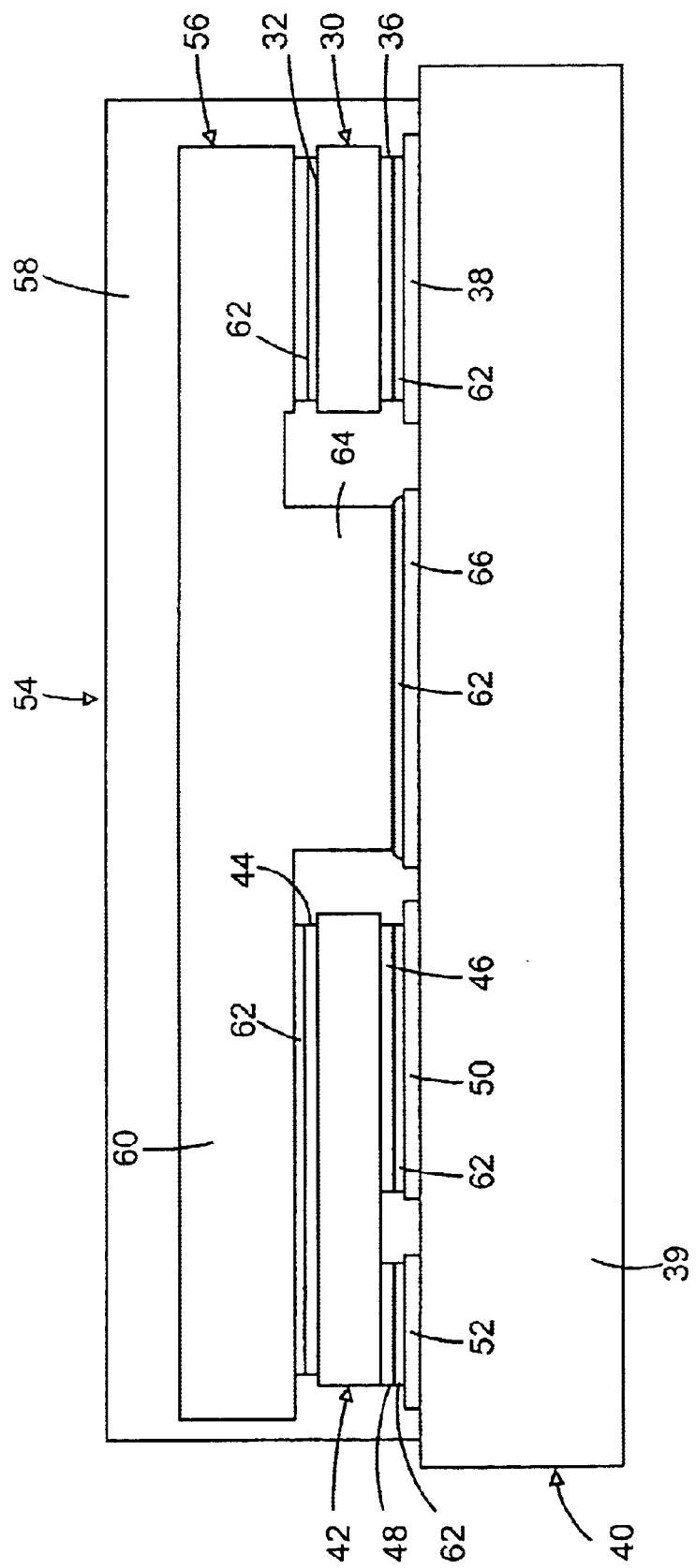
FIG. 6 shows a cross-sectional view of an MCM according to the second embodiment of the present invention viewed along line 5—5 looking in the direction of the arrows.

FIG. 6 shows a cross-sectional view of an MCM 54 according to the second embodiment of the present invention. The cross-sectional view shown in FIG. 6, is taken along line 5—5 of FIG. 4 viewed in the direction of the arrows shown therein. In the embodiment shown by FIG. 6, conductive element 56 includes connector 64 which is disposed between conventional MOSFET 30 and flip-chip MOSFET 42. Otherwise, all of the features of the second embodiment are identical to those in the first embodiment and thus will not be described.

As illustrated by FIGS. 5 and 6, conventional MOSFET 30 and flip-chip MOSFET 42 are "sandwiched" between web portion 60 of conductive element 56 and circuit board 40 and, therefore, due to their respective thicknesses, space web portion 60 of conductive element 56 from circuit board 40. To make electrical connection to conductive pad 66, therefore, connector 64 of conductive element 56 is extended to reach conductive pad 66.

As is clear from FIG. 5, conductive element 56 is L-shaped in that connector 64 of conductive element 56 is disposed at an end thereof. A conductive element 56 as used in the second embodiment of the present invention may be T-shaped and thus will have its connector 64 positioned somewhere near the middle of web portion 60 as shown in FIG. 6.

Figure 7:
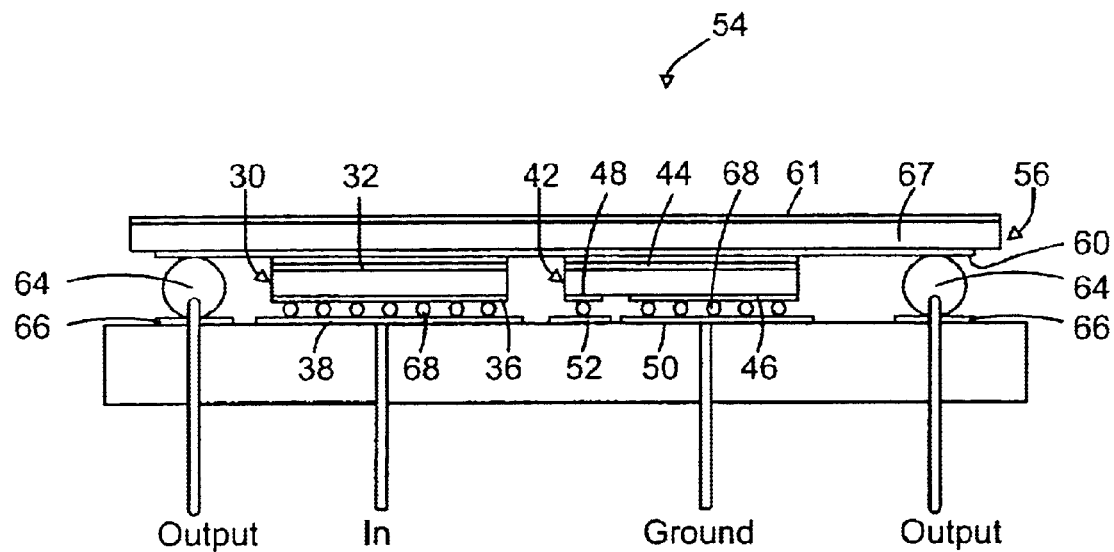
FIG. 7 schematically shows a cross-sectional view of a portion of an MCM according to the third embodiment of the present invention.

Referring now to FIG. 7, MCM 54 according to the third embodiment of the present invention includes conductive element 56 which has a flat web portion 60 that, similar to the first and second embodiments, connects drain contact 44 of flip-chip MOSFET 42 to source contact 32 of conventional MOSFET 30. Conductive element 56 as used in the third embodiment of the present invention may be an IMS having one metallic conductive layer serving as flat web portion 60, a thermally conductive but electrically insulating ceramic body 67 and another metallic conductive layer 61 disposed opposite to web portion 60. Using an IMS in the third embodiment allows for the proper routing and connection of the gate electrode (not shown) of conventional MOSFET 30.

Conductive element 56 in the third embodiment of the present invention also includes connectors 64. Connectors 64 in the third embodiment of the present invention are conductive balls that are connected to conductive pads 66 as well as web portion 60. In the third embodiment, drain contact 36 of conventional MOSFET 30, and source contact 46 and gate contact 48 of flip-chip MOSFET 42 are connected to respective conductive pads 38, 50, 52 through conductive balls 68.

Figure 8A:
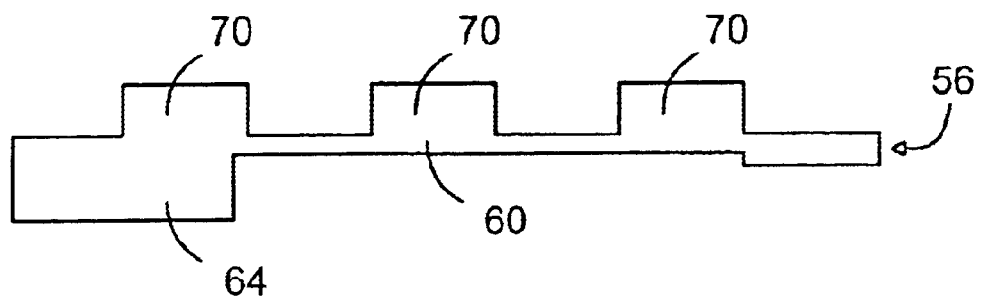
FIGS. 8A–8C show variations in a common conductive element used in an MCM according to the present invention.
Figure 8B:
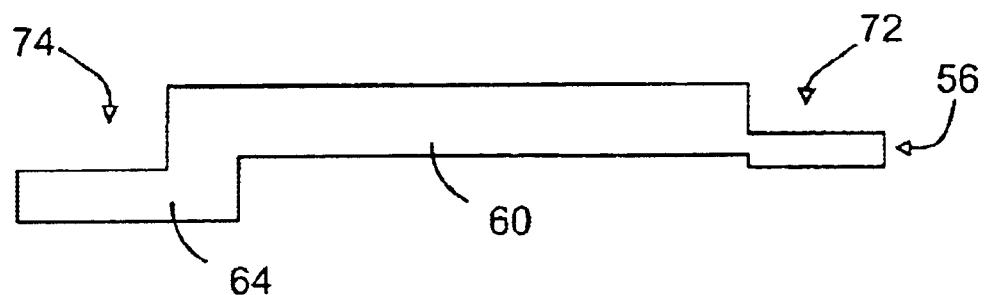
Figure 8C:
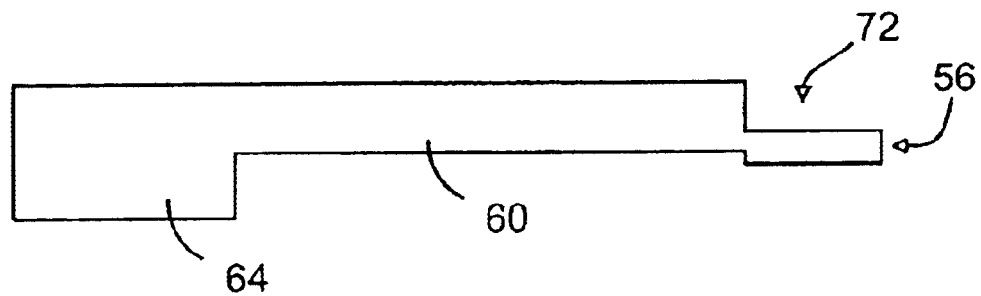

Referring now to FIGS. 8A–8C, a conductive element 56 according to the present invention may include other enhancements. For example, as shown by FIG. 8A, a common conductive element 56 according to the first embodiment may include ridges 70 on the top surface thereof. Ridges 70 increase the top surface area of conductive element 56 which may help dissipate more heat and help conductive element 56 adhere better to the resin mold of molded housing 58 of MCM 54.

Referring to FIG. 8B, conductive element 56 according to the first embodiment may include a pair of recesses 72, 74 disposed at opposing edges thereof. Recesses 72, 74 allow resin mold to be formed around conductive element 56 thereby obtaining better adhesion between conductive element 56 and the resin mold of molded housing 58.

Referring to FIG. 8C, conductive element 56 according to the first embodiment may be made only with one recess 72.

All the enhancements shown in FIGS. 8A–8C may also be applied to conductive element 56 as used in the second and third embodiments.

Figure 9:
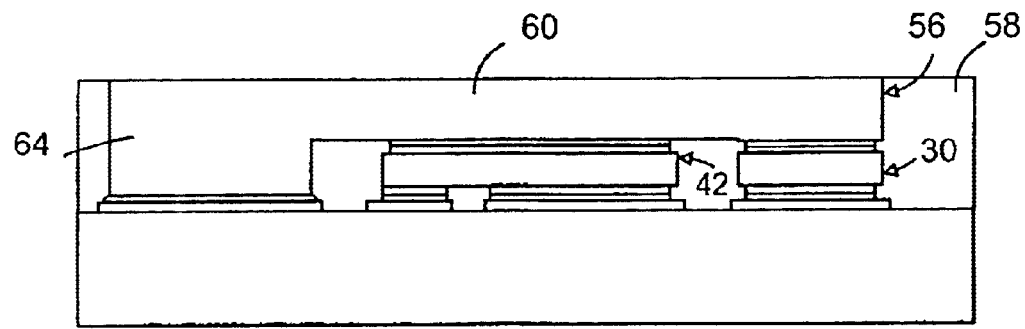
FIG. 9 schematically shows a cross-sectional view of a portion of an MCM according to the fourth embodiment of the present invention.

Referring to FIG. 9, according to the fourth embodiment of the present invention, conductive element 56 may be exposed through molded housing 58 to improve heat dissipation from the top of the MCM.

In the preferred embodiment of the present invention, conductive element 56 may be made from copper or a copper alloy. Other suitable materials, however, may be used without deviation from the present invention.

Also, in the preferred embodiment of the present invention, the power semiconductor devices that form the half-bridge circuit may be MOSFETs. Other power semiconductor devices such as IGBTs, power bipolar transistors, thyristors, and power diodes, etc. may replace one or both power semiconductor devices in an MCM that includes a conductive element 56 according to the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A multichip module comprising:
   a substrate having a first conductive pad, a second conductive pad and a third conductive pad disposed on a major surface thereof;
   a T-shaped or an L-shaped conductive element, said conductive element including a web portion and a connector extending from a first major surface of said web portion;
   a first semiconductor die and a second semiconductor die, each semiconductor die having a first contact of a first designation disposed on a first major surface thereof and a second contact of a second designation disposed on a second opposing major surface thereof;
   wherein said first contact of said first semiconductor die is electrically connected to said first conductive pad, said second contact of said second semiconductor die is connected to said second conductive pad, said connector is connected to said third conductive pad, and said second contact of said first semiconductor die and said first contact of said second semiconductor die are connected to said first major surface of said web portion.

2. A multichip module according to claim 1, wherein said substrate is one of an insulated metal substrate, double bonded copper and a lead frame structure.

3. A multichip module according to claim 1, wherein said semiconductor die are MOSFETs, said first contacts of which are source contacts and said second contacts of which are drain contacts.

4. A multichip module according to claim 1, wherein each of said semiconductor die is one of MOSFET and IGBT.

5. A multichip module according to claim 1, further comprising a molded housing.

6. A multichip module according to claim 5, wherein said conductive element is at least partially exposed through said molded housing to dissipate heat from said semiconductor die.

7. A multichip module according to claim 1, wherein said web portion includes two free ends, and said connector is disposed at one end of said web portion.

8. A multichip module according to claim 1, wherein said web portion includes two free ends, said connector is disposed between said two free ends.

9. A multichip module according to claim 1, further comprising a heat sink in thermal contact with said substrate.

10. A multichip module according to claim 1, further comprising a heat sink in thermal communication with said element.

11. A multichip module according to claim 1, wherein said web portion includes a plurality of ridges extending from a second major surface of said web portion.

12. A multichip module according to claim 1, wherein said web portion includes a recess at each opposing end thereof.

13. A multichip module according to claim 1, wherein said web portion includes a recess at one end thereof.

14. A multichip module according to claim 1, wherein said element includes another ball contact, each of said ball contacts being disposed at a respective end of said web portion.

15. A multichip module comprising:
    a substrate having a first conductive pad, a second conductive pad and a third conductive pad disposed on a major surface thereof;
    a conductive element, said conductive element including a web portion and a connector extending from a first major surface of said web portion;
    a first semiconductor die and a second semiconductor die, each semiconductor die having a first contact of a first designation disposed on a first major surface thereof and a second contact of a second designation disposed on a second opposing major surface thereof;
    wherein said first contact of said first semiconductor die is electrically connected to said first conductive pad, said second contact of said second semiconductor die is connected to said second conductive pad, said connector is connected to said third conductive pad, and said second contact of said first semiconductor die and said first contact of said second semiconductor die are connected to said first major surface of said web portion; and
    wherein said connector is a ball contact.

16. A multichip module comprising:
    a substrate having a first conductive pad, a second conductive pad and a third conductive pad disposed on a major surface thereof;
    a T-shaped or an L-shaped conductive element, said conductive element including a web portion and a connector extending from a first major surface of said web portion;
    a first MOSFET and a second MOSFET, each MOSFET having a source contact disposed on a first major surface thereof and a drain contact on a second opposing major surface thereof;

wherein said source contact of said first semiconductor die is electrically connected to said first conductive pad, said drain contact of said second semiconductor die is connected to said second conductive pad, said connector is connected to said third conductive pad, and said drain contact of said first semiconductor die and said source contact of said second semiconductor die are connected to said first major surface of said web portion.

17. A multichip module according to claim 16, wherein said substrate is one of an insulated metal substrate and double bonded copper.

18. A multichip module according to claim 16, further comprising a molded housing.

19. A multichip module according to claim 16, wherein said web portion includes two free ends, and said connector is disposed at one end of said web portion.

20. A multichip module according to claim 16, wherein said web portion includes two free ends, said connector is disposed between said two free ends.

21. A multichip module according to claim 16, further comprising a heat sink in thermal contact with said substrate.

22. A multichip module according to claim 16, further comprising a heat sink in thermal communication with said element.

23. A multichip module according to claim 16, wherein said web portion includes a plurality of ridges extending from a second major surface of said web portion.

24. A multichip module according to claim 16, wherein said web portion includes a recess at each opposing end thereof.

25. A multichip module according to claim 16, wherein said web portion includes a recess at one end thereof.

26. A multichip module comprising:

a substrate having a first conductive pad, a second conductive pad and a third conductive pad disposed on a major surface thereof;

a conductive element, said conductive element including a web portion and a connector extending from a first major surface of said web portion;

a first MOSFET and a second MOSFET, each MOSFET having a source contact disposed on a first major surface thereof and a drain contact on a second opposing major surface thereof;

wherein said source contact of said first semiconductor die is electrically connected to said first conductive pad, said drain contact of said second semiconductor die is connected to said second conductive pad, said connector is connected to said third conductive pad, and said drain contact of said first semiconductor die and said source contact of said second semiconductor die are connected to said first major surface of said web portion; and wherein said connector is a ball contact.

27. A multichip module according to claim 26, wherein said element includes another ball contact, each of said ball contacts being disposed at a respective end of said web portion.

* * * * *